United States Patent
Chrappan Soldavini et al.

(10) Patent No.: US 9,762,415 B2
(45) Date of Patent: Sep. 12, 2017

(54) LINE DRIVER CIRCUIT AND METHOD

(71) Applicant: STMICROELECTRONICS S.r.l., Agrate Brianza (MB) (IT)

(72) Inventors: Francesco Chrappan Soldavini, San Donato Milanese (IT); Michele Fedeli, Pavia (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 176 days.

(21) Appl. No.: 14/748,509

(22) Filed: Jun. 24, 2015

(65) Prior Publication Data
US 2016/0105295 A1 Apr. 14, 2016

(30) Foreign Application Priority Data

Oct. 14, 2014 (IT) .................. TO2014A0831

(51) Int. Cl.
| | | |
|---|---|---|
| *H04L 25/02* | (2006.01) | |
| *H03K 19/00* | (2006.01) | |
| *H03K 19/094* | (2006.01) | |
| *H04B 1/04* | (2006.01) | |

(52) U.S. Cl.
CPC ..... *H04L 25/0278* (2013.01); *H03K 19/0005* (2013.01); *H03K 19/094* (2013.01); *H04L 25/0272* (2013.01); *H04L 25/0282* (2013.01); *H04B 2001/0408* (2013.01)

(58) Field of Classification Search
CPC ............. H04L 25/0272; H04L 25/0278; H04L 25/0282
See application file for complete search history.

(56) References Cited

U.S. PATENT DOCUMENTS

| | | | | |
|---|---|---|---|---|
| 6,665,347 B2* | 12/2003 | van Bavel | ........... | H04L 25/0266 326/30 |
| 6,812,733 B1* | 11/2004 | Plasterer | .......... | H03K 3/356104 326/115 |
| 7,639,746 B2* | 12/2009 | Cornelius | ................ | H04B 3/04 375/219 |
| 7,863,935 B2* | 1/2011 | Kan | ...................... | H04L 25/028 326/82 |
| 8,149,024 B2* | 4/2012 | Liu | ................ | H03K 19/018528 327/108 |
| 9,054,578 B2* | 6/2015 | Hsieh | ..................... | H02M 1/088 |
| 9,312,846 B2* | 4/2016 | Wu | ........................ | H03K 17/16 |
| 2005/0032501 A1* | 2/2005 | Huang | .................... | H04M 9/00 455/402 |
| 2005/0195904 A1 | 9/2005 | Huang et al. | | |

FOREIGN PATENT DOCUMENTS

| | | |
|---|---|---|
| WO | 03/003607 | 1/2003 |
| WO | 03003607 | 1/2003 |

* cited by examiner

*Primary Examiner* — Patrick O'Neill
(74) *Attorney, Agent, or Firm* — Slater Matsil, LLP

(57) ABSTRACT

A driver circuit for driving a transmission line includes a voltage driver and a current driver. The voltage driver is for driving the transmission line with a first voltage gain in a first operation mode. The current driver is activatable in a second operation mode for driving, together with the voltage driver, the transmission line with a second voltage gain. The transmission line may be an Ethernet-over-copper transmission line with electrical data signals from a data generator.

19 Claims, 1 Drawing Sheet

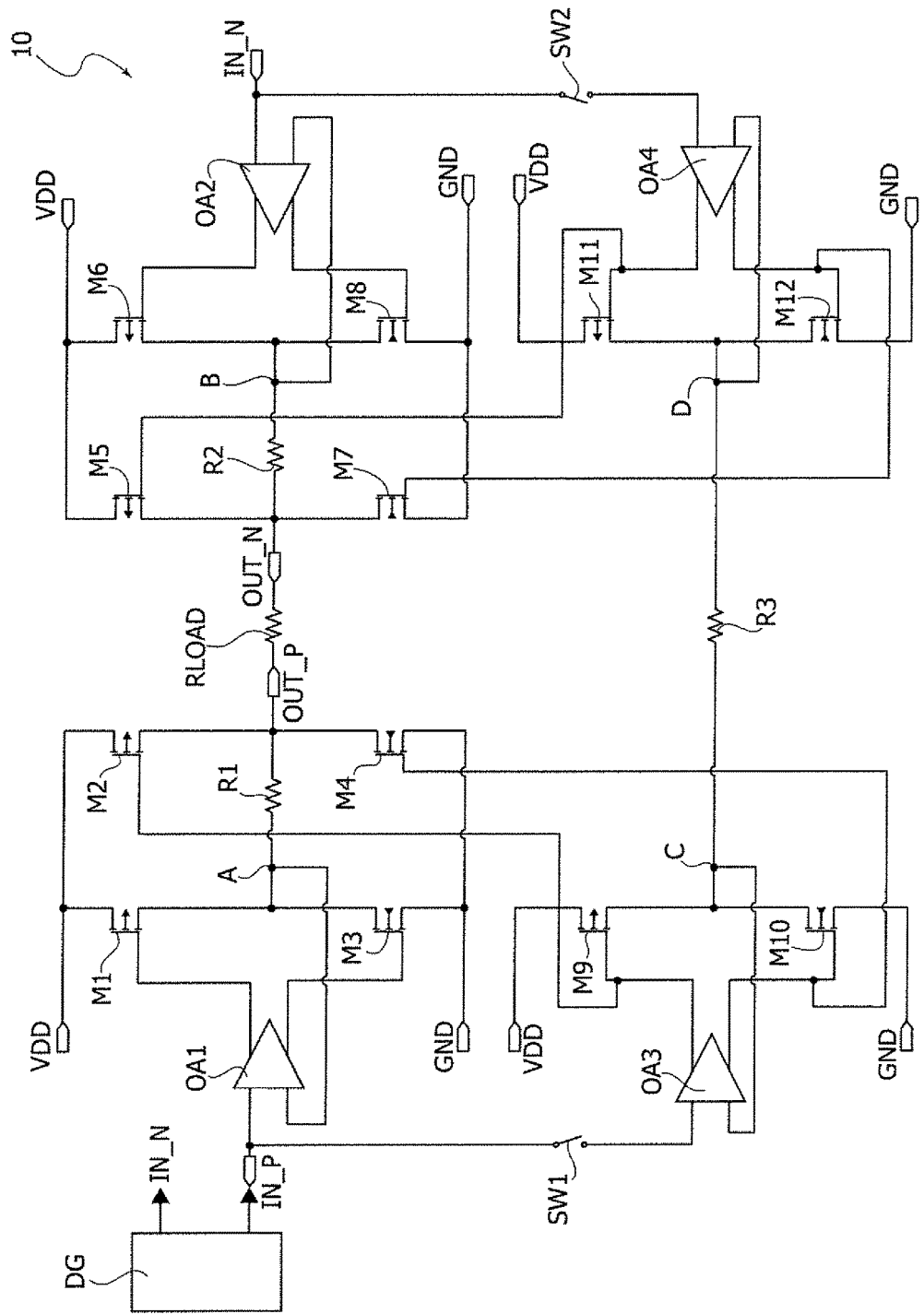

LINE DRIVER CIRCUIT AND METHOD

FIELD OF THE INVENTION

The description relates to line driver circuits. One or more embodiments may apply to Ethernet line drivers, such as for Ethernet transmission over copper cables in compliance with the IEEE 802.3 standard, e.g., with a physical (PHY) interface working with at least 10 Mb/s (10BASET) and 100 Mb/s (100BASE-TX).

BACKGROUND

A 100 ohm unshielded twisted cable is a conventional medium for Ethernet transmission over copper cables. Standard-dictated requirements for the transmitter and the receiver at the two ends of the cable in terms of return loss may translate into a well-controlled and matched impedance of the transmitter and receiver circuitry.

Different standards may involve managing different line voltages as well as different transmitter amplitudes. The transmitter and the receiver are matched to the 100 ohm impedance of the line.

SUMMARY

In the scenario discussed in the foregoing there is a need for a power efficient driver capable of complying, e.g., with both 10BASE-T and 100BASE-T/1000BASE-T requirements, with a limited voltage supply. The limited voltage supply may be dictated by application and technology options, e.g., 3.3 or 2.5 V.

One or more embodiments have the objective of satisfying such a need by improving over conventional approaches. One or more embodiments achieve this objective using a driver circuit having the characteristics recited in the claims that follow. One or more embodiments may also refer to a corresponding method.

The claims are an integral part of the disclosure as provided herein. One or more embodiments may provide a transmission line driver circuit operating in a first operating mode and in a second operating mode, including a voltage driver for driving the transmission line in the first operative mode from a data generator with a first voltage gain, and a current replica driver for driving, together with the voltage driver, the transmission line in the second operative mode from the the data generator with a second voltage gain.

One or more embodiments may thus include a voltage driver operating alone in a first operating mode, while operating together with a current replica driver in the second operating mode.

BRIEF DESCRIPTION OF THE DRAWINGS

One or more embodiments will now be described, purely by way of a non-limiting example, with reference to the annexed FIGURE, designated FIG. 1.

FIG. 1 is an exemplary circuit diagram of a driver according to one or more embodiments.

DETAILED DESCRIPTION

In the ensuing description one or more specific details are illustrated, aimed at providing an in-depth understanding of examples of the one or more embodiments. The embodiments may be obtained without one or more of the specific details, or with other methods, components, materials, etc. In other cases, known structures, materials, or operations are not illustrated or described in detail so that certain aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more of the embodiments. The references used herein are provided merely for convenience and hence do not define the scope of protection or the scope of the embodiments.

A 100 ohm unshielded twisted cable is a conventional physical medium used for Ethernet transmission over copper cables. Both the transmitter and the receiver match the 100 ohm typical impedance of the line.

A transmitter according to the 10BASE-T standard may have a peak amplitude of 5V peak-to-peak differential. Transmission and reception operate on separate pairs, and a signal amplitude on the line may be assumed similar to the transmitter amplitude.

A transmitter according to the 100BASE-T standard may have a peak amplitude of 2V peak-to-peak differential. Transmission and reception operate on separate pairs, and a signal amplitude on the line may be assumed similar to the transmitter amplitude.

A transmitter according to the 1000BASE-T standard may have a peak amplitude of 2V peak-to-peak differential. Transmission and reception operate in parallel on all the pairs. The signal amplitude on the line may be assumed to be close to twice the transmitter amplitude. It may be actually higher due to signal reflection, and a peak signal swing on the line of 4.8V peak-to-peak may be assumed.

Transmitter topologies adapted to meet standard requirements in terms of a well controlled impedance may be ascribed to three basic types, that is, voltage mode drivers, current mode drivers, and active impedance drivers. Each of these types of drivers exhibits both advantages and drawbacks.

A voltage mode driver may require a voltage supply higher than twice the peak voltage to be transmitted. The peak current consumption, without accounting for the driver quiescent current, is defined by the peak transmitter voltage divided by the line impedance.

A voltage mode driver may include two operational amplifiers (opamps) configured in such a way to provide low output impedance (approximately zero) and two internal series resistors R1, R2. The transmitter impedance as seen from the driver output terminal is equal to R1 and R2 connected to the opamp outputs.

Assuming that RL is a generic line termination impedance, the following relationship may apply:

$$R1=R2;\ R1+R2=RL.$$

Due to the voltage drop on the internal resistors R1 and R2 (which is equal to the drop across the line termination) to produce a signal Vo applied on the line, the two opamps may have to deliver a voltage with an amplitude twice Vo. This is with a supply current which (by neglecting the quiescent current consumption on the two opamps) may be equal to the output voltage Vo divided by the termination resistor value RL.

A current mode driver may require a voltage supply higher than the peak voltage to be transmitted. The peak current consumption (by neglecting the driver quiescent current) may be twice the peak transmitter voltage divided by the line impedance.

A current mode driver may include two operational amplifiers (opamps) configured in such a way to provide a high output impedance (approximately infinite) and two internal parallel resistors R1, R2. An Operational Transconductance Amplifier (OTA) is exemplary of a high output impedance opamp.

The transmitter impedance as seen from the driver output terminal is equal to R1 and R2 connected to the OTA outputs. Assuming that RL is still a generic line termination impedance, the same relationships considered above apply.

Due to the load represented by the parallel connection of the line termination resistance RL and the internal terminations R1 and R2 to produce a signal Vo applied on the line, the two OTAs may have to deliver a voltage equal to Vo. This is with a supply current which (neglecting the quiescent current consumption on the two OTAs) may be equal to twice the requested output voltage Vo divided by the termination resistor value RL.

Active impedance drivers may give rise to a fairly complex arrangement similar to a voltage mode driver or current mode driver instead of having a "physical" internal resistor to provide line impedance matching. A sensing circuit is provided in order to read the current or voltage on the line and adapt or "tune" the driver impedance to simulate the required value. This may involve additional complexity and difficulties in meeting the standard requirements.

One or more embodiments as disclosed herein provide power efficiency in a driver adapted to manage both 10BASE-T and 100BASE-T/1000BASE-T requirements with a limited voltage supply, e.g., 3.3 or 2.5 V as possibly dictated by application and technology options.

One or more embodiments may be based on the recognition that when the voltage is limited, e.g., to 3.3V or even lower, an approach suited for meeting the 10BASE-T amplitude requirements may be a current mode. This is where current consumption is twice with respect to the voltage mode, but the supply voltage is just a few hundreds of mV higher that the transmitted voltage. An approach suited for meeting the 100BASE-T/1000BASE-T requirements may be a voltage mode driver, saving in this way power, due to the limited voltage required by the standard.

While the 10BASE-T mode can be addressed with a current mode driver, two possibilities are available for the 100BASE-T and 1000BASE-T modes.

Documents such as WO 03/003607 A1 are exemplary of a mixed approach, involving a combination of a voltage driver and a current driver where the internal termination resistors are connected between the line terminal and the outputs of the voltage amplifier. When the driver operates in a voltage mode, the current driver is off, and when the driver operates in a current mode the voltage driver is on and provides the required common mode to drive the termination resistors.

In one or more embodiments as disclosed herein, power consumption in the current mode may be reduced by having the voltage driver operate together with the current driver, while also reducing, notionally to zero, the power dissipated with the current mode in the internal termination resistors.

The circuit diagram in FIG. 1 is exemplary of a line driver 10, e.g., an Ethernet driver, intended to operate on a line termination resistance RLOAD connected between (differential) output terminals OUT_P and OUT_N. A 100 ohm unshielded twisted cable is exemplary of such a line.

In the exemplary circuit diagram of FIG. 1, VDD and GND denote supply voltage and ground terminals, respectively. The exemplary line driver 10 of FIG. 1 exhibits an essentially complementary (i.e., symmetrical) layout, including two complementary voltage mode drivers including two operational amplifiers OA1 and OA2 and four power devices (e.g., MOSFETs) M1, M3, M6 and M8. In one or more embodiments as disclosed herein, when the driver is in the voltage mode, all the other components (to be described in the following) may be in an off condition.

The signal to be transmitted over the line (Load RLOAD) as generated, e.g., by a data generator DG, is differentially applied, e.g., as V(IN_P)-V(IN_N), to two input terminals or pins, IN_P and IN_N.

The two opamps OA1 and OA2 replicate the respective input signals applied at IN_P and IN_N on the points A and B to drive the line termination represented by the resistor RLOAD through two respective internal termination resistors R1 and R2.

The signal applied between the opamp inputs IN_P, IN_N is scaled down (e.g., by a factor of two), that is applied with a first voltage gain due to the partitioning between the line impedance RLOAD and the two internal matched termination resistors R1 and R2.

In the exemplary line driver 10 of the FIGURE two "current mode" drivers are provided including, e.g., opamps OA3 and OA4 to be activated when two associated switches SW1 and SW2 are closed.

In one or more embodiments, one of these two additional drivers, e.g., the one including the opamp OA3 plus power devices (e.g. MOSFETs) M9 and M10, drives one side (e.g., the left side in FIG. 1) of a resistor R3, while the other driver, e.g., including the opamp OA4 plus power devices (e.g., MOSFETs) M11 and M12, drives the other (here, right) side of the resistor R3.

In one or more embodiments, a current may thus flow through R3 equal to the differential input of the driver, that is the signal V(IN_P)-V(IN_N) applied between the inputs IN_P, IN_N divided by the resistance value of the resistor R3.

This current will flow into devices M9, M12 or M10, M11 depending on the current direction. The devices M2, M4, M5, M7 (e.g. MOSFETs) will act as a current mirror to mirror the current flowing into M9, M10, M11, M12, thus injecting a scaled current (depending on the mirror ratio between the device pairs) into the line termination resistor RLOAD.

In one or more embodiments with a Mirror Ratio MR, between the mirror devices M2-M9, M4-M10, M5-M11, M7-M12, the current I(RLOAD) injected into the load RLOAD will have an intensity equal to the input signal amplitude, V(IN_P)-V(IN_N) divided by the value of the resistor R3, namely:

$$I(RLOAD)=MR*V(IN\_P-IN\_N)/R3$$

In one or more embodiments, it may be reasonably assumed that the voltage drivers (e.g., OA1, OA2 and the associated power devices) do not inject any current into RLOAD, so that the line voltage will be given by:

$$V(RLOAD)=RLOAD*MR*V(IN\_P-IN\_N)/R3$$

Which if R3=MR*RLOAD, simplifies to:

$$V(RLOAD)=V(IN\_P-IN\_N)$$

In this case, the voltage on the RLOAD line termination (s) is the same that is present on the outputs of the voltage drivers. As a consequence, the current flowing through R1 and R2 is zero. Under these circumstances, the voltage drop across R1 and R2 is zero, and the voltage across the line is equal to the driver input voltage (thus having a second, e.g., unitary, voltage gain).

An extra gain of a factor of two (second voltage gain) with respect to the normal voltage mode (first voltage gain) may thus be achieved in one or more embodiments. In one or more embodiments, the line voltage can be driven up to a few hundred mV below the supply voltage VDD, which may reach 2.5V on the line with a voltage supply of 3.3V or lower. This may be similar to a conventional current mode, but with no current through the termination resistors R1 and R2, thus dispensing with the power penalty of a conventional current driver architecture.

In one or more embodiments, a correct line impedance can be ensured. If the line is driven externally with a signal, this will be terminated onto the two termination resistors R1 and R2 with their terminals connected to the voltage driver outputs, and a virtual ground for the signal coming from outside.

One or more embodiments may thus provide a driver circuit for driving a transmission line RLOAD with electrical data signals from a data generator DG. The circuit includes a voltage driver OA1, M1, M3; OA2, M6, M8 for driving the transmission line RLOAD with a first voltage gain in a first operation mode, and a current driver OA3, M9, M10, M2, M4; OA4, M11, M12, M5, M7 activatable (e.g., by closing the switches SW1, SW2) in a second operation mode for driving together with the voltage driver OA1, M1, M3; OA2, M6, M8 the transmission line RLOAD with a second voltage gain.

In one or more embodiments, the voltage driver may include at least one operational amplifier OA1, OA2 driving a respective power stage M1, M3; M6, M8.

In one or more embodiments, the current driver may include at least one operational amplifier OA3, OA4 driving a respective power stage M9, M10; M11, M12.

In one or more embodiments the voltage driver OA1, M1, M3; OA2, M6, MB may include at least one output resistor R1, R2 for coupling with the transmission line RLOAD.

In one or more embodiments the current driver may include a first stage OA3, M9, M10; OA4, M11, M12 for generating a replica of the electrical data signals from the data generator DG, and a second stage M2, M4; M5, M7 to mirror the current flowing in the first stage into a drive current for the transmission line RLOAD with a mirror ratio. This reduces the voltage drop across the at least one output resistor R1, R2.

One or more embodiments may include at least one switch SW1, SW2 activatable in the second operation mode to feed the input electrical data signals V(IN_P)-V(IN_N) as applied on terminals IN_P, IN_N to the current driver OA3, M9, M10, M2, M4; OA4, M11, M12, M5, M7.

In one or more embodiments the voltage driver OA1, M1, M3; OA2, M6, MB and the current driver OA3, M9, M10, M2, M4; OA4, M11, M12, M5, M7 may have a differential layout with differential inputs IN_P, IN_N for the electrical data signals V(IN_P)-V(IN_N) from the data generator DG and differential outputs OUT_P, OUT_N for driving the transmission line RLOAD.

In one or more embodiments, the first stage may include complementary portions OA3, M9, M10 and OA4, M11, M12 for generating a replica of the electrical data signals on the differential inputs IN_P, IN_N and a coupling resistor R3 interposed between the complementary portions OA3, M9, M10 and OA4, M11, M12. The mirror ratio MR is a function of the resistance value R3 of the coupling resistor.

In one or more embodiments, the coupling resistor has a resistance value R3 given by the product MR*RLOAD of the mirror ratio MR and the impedance value RLOAD of the transmission line.

One or more embodiments may be used for driving an Ethernet-over-copper transmission line.

In one or more embodiments a transmission line RLOAD may be driven with electrical data signals form a data generator DG. In a first operation mode, the transmission line RLOAD is driven with a first voltage gain by means of a voltage driver OA1, M1, M3; OA2, M6, M8. In a second operation mode, the transmission line RLOAD is driven with a second voltage gain by means of a current driver OA3, M9, M10, M2, M4; OA4, M11, M12, M5, M7 activated together with the voltage driver OA1, M1, M3; OA2, M6, MB.

Without prejudice to the underlying principles, the details and embodiments may vary, even significantly, with respect to what is illustrated herein purely by way of a non-limiting example, without thereby departing from the extent of protection. The extent of protection is determined by the claims that follow.

That which is claimed is:

1. A driver circuit for driving a transmission line with electrical data signals from a data generator, the driver circuit comprising:
    a voltage driver configured to drive the transmission line with a first voltage gain in a first operation mode; and
    a current driver activatable in a second operation mode to drive, together with said voltage driver, the transmission line with a second voltage gain, wherein said current driver comprises at least one power stage and at least one amplifier configured to drive said at least one power stage.

2. The driver circuit of claim 1, wherein said voltage driver comprises at least one power stage, and at least one amplifier configured to drive said at least one power stage.

3. The driver circuit of claim 1, wherein said voltage driver comprises at least one output resistor configured to be coupled with said transmission line; and said current driver comprises:
    a first stage configured to generate a replica of the electrical data signals from the data generator; and
    a second stage configured to mirror current flowing in said first stage into a drive current for the transmission line with a mirror ratio, thereby reducing the voltage drop across said at least one output resistor.

4. The driver circuit of claim 3, wherein said voltage driver and said current driver have a differential layout with differential inputs for the electrical data signals from the data generator and differential outputs to drive the transmission line.

5. The driver circuit of claim 4, wherein said first stage comprises:
    complementary portions configured to generate a replica of the electrical data signals on said differential inputs; and
    a coupling resistor between said complementary portions whereby the mirror ratio is a function of the resistance value of said coupling resistor.

6. The driver circuit of claim 5, wherein said coupling resistor has a resistance value given by a product of the mirror ratio and an impedance value of the transmission line.

7. The driver circuit of claim 1, further comprising at least one switch activatable in the second operation mode to feed the electrical data signals to said current driver.

8. The driver circuit of claim 1, wherein the transmission line is an Ethernet-over-copper transmission line.

9. A driver circuit for driving a transmission line with electrical data signals from a data generator, the driver circuit comprising:
   a voltage driver comprising at least one output resistor coupled with the transmission line and configured to drive the transmission line with a first voltage gain in a first operation mode; and
   a current driver activatable in a second operation mode to drive, together with said voltage driver, the transmission line with a second voltage gain, said current driver comprising
      a first stage configured to generate a replica of the electrical data signals from the data generator, and
      a second stage configured to mirror current flowing in said first stage into a drive current for the transmission line with a mirror ratio so as to reduce the voltage drop across said at least one output resistor.

10. The driver circuit of claim 9, wherein said voltage driver comprises at least one power stage, and at least one amplifier configured to drive said at least one power stage; and wherein said current driver comprises at least one power stage, and at least one amplifier configured to drive said at least one power stage.

11. The driver circuit of claim 9, further comprising at least one switch activatable in the second operation mode to feed the electrical data signals to said current driver.

12. The driver circuit of claim 9, wherein said voltage driver and said current driver have a differential layout with differential inputs for the electrical data signals from the data generator and differential outputs to drive the transmission line.

13. The driver circuit of claim 12, wherein said first stage comprises:
   complementary portions configured to generate a replica of the electrical data signals on said differential inputs; and
   a coupling resistor between said complementary portions whereby the mirror ratio is a function of the resistance value of said coupling resistor.

14. A method of driving a transmission line with electrical data signals from a data generator, the method comprising:
   in a first operation mode, driving the transmission line with a first voltage gain using a voltage driver; and
   in a second operation mode, driving the transmission line with a second voltage gain using a current driver activated together with the voltage driver, wherein the voltage driver comprises at least one power stage, and at least one amplifier configured to drive the at least one power stage; and wherein the current driver comprises at least one power stage, and at least one amplifier configured to drive the at least one power stage.

15. The method of claim 14, wherein the voltage driver comprises at least one output resistor for coupling with the transmission line; and the current driver comprises:
   a first stage configured to generate a replica of the electrical data signals from the data generator; and
   a second stage configured to mirror current flowing in the first stage into a drive current for the transmission line with a mirror ratio, thereby reducing the voltage drop across the at least one output resistor.

16. The method of claim 15, wherein the voltage driver and the current driver have a differential layout with differential inputs for the electrical data signals from the data generator and differential outputs to drive the transmission line.

17. The method of claim 16, wherein the first stage comprises:
   complementary portions configured to generate a replica of the electrical data signals on the differential inputs; and
   a coupling resistor between the complementary portions whereby the mirror ratio is a function of the resistance value of the coupling resistor.

18. The method of claim 14, further comprising at least one switch activatable in the second operation mode to feed the electrical data signals to the current driver.

19. The method of claim 14, wherein the transmission line is an Ethernet-over-copper transmission line.

* * * * *